(12) United States Patent
Hong et al.

(10) Patent No.: US 11,528,800 B2
(45) Date of Patent: Dec. 13, 2022

(54) ELECTRONIC DEVICE MODULE

(71) Applicant: Samsung Electro-Mechanics Co., Ltd., Suwon-si (KR)

(72) Inventors: Seok Yoon Hong, Suwon-si (KR); Han Su Park, Suwon-si (KR); Hyuk Ki Kwon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 104 days.

(21) Appl. No.: 17/078,522

(22) Filed: Oct. 23, 2020

(65) Prior Publication Data
US 2022/0046782 A1    Feb. 10, 2022

(30) Foreign Application Priority Data

Aug. 7, 2020    (KR) .................. 10-2020-0098917

(51) Int. Cl.
| | |
|---|---|
| H05K 1/00 | (2006.01) |
| H05K 1/02 | (2006.01) |
| H01Q 9/16 | (2006.01) |
| H01Q 1/02 | (2006.01) |
| H01Q 9/04 | (2006.01) |

(52) U.S. Cl.
CPC ............ H05K 1/0203 (2013.01); H01Q 1/02 (2013.01); H01Q 9/0407 (2013.01); H01Q 9/16 (2013.01); H05K 1/0216 (2013.01); H05K 2201/10098 (2013.01)

(58) Field of Classification Search
None
See application file for complete search history.

(56) References Cited

U.S. PATENT DOCUMENTS

| | | | |
|---|---|---|---|
| 5,488,254 A | 1/1996 | Nishimura et al. | |
| 6,853,069 B2* | 2/2005 | Akram | H01L 24/75 257/713 |
| 7,813,133 B2* | 10/2010 | Iijima | H01L 23/3675 428/210 |
| 8,125,788 B2* | 2/2012 | Hatanaka | H01L 25/03 361/764 |
| 9,756,718 B2* | 9/2017 | Kataoka | H05K 1/0216 |
| 10,264,677 B2* | 4/2019 | Kawasaki | H03H 9/02834 |
| 10,498,195 B2* | 12/2019 | Mergener | H01L 23/34 |
| 10,649,503 B2* | 5/2020 | Sahu | H01L 24/73 |
| 10,772,245 B2* | 9/2020 | Craig | H05K 1/021 |
| 2010/0258839 A1* | 10/2010 | Matsue | H01L 51/5243 257/E33.059 |
| 2020/0027811 A1* | 1/2020 | Eid | H01L 23/3677 |
| 2021/0249333 A1* | 8/2021 | Lewison | H01L 23/427 |

FOREIGN PATENT DOCUMENTS

| | | |
|---|---|---|
| JP | 2857725 B | 12/1998 |
| KR | 2000-0045081 A | 7/2000 |

* cited by examiner

*Primary Examiner* — Courtney L Smith
(74) *Attorney, Agent, or Firm* — NSIP Law (57) ABSTRACT

An electronic device module includes: a substrate; a sealing portion disposed on a first surface of the substrate; an exothermic device disposed on the first surface of the substrate and embedded in the sealing portion; and a heat radiating portion at least partially embedded in the sealing portion. A lower surface of the heat radiating portion is bonded to one surface of the exothermic device. A side surface of the heat radiating portion is curved and is entirely in contact with the sealing portion. A plurality of grooves are disposed in the side surface of the heat radiating portion.

18 Claims, 4 Drawing Sheets

ELECTRONIC DEVICE MODULE

CROSS-REFERENCE TO RELATED APPLICATIONS

This application claims the benefit under 35 U.S.C. § 119(a) of Korean Patent Application No. 10-2020-0098917 filed on Aug. 7, 2020 in the Korean Intellectual Property Office, the entire disclosure of which is incorporated herein by reference for all purposes.

BACKGROUND

1. Field

The following description relates to an electronic device module.

2. Description of Related Art

There has been increased demand for portable electronic products in the electronic products market. To meet such demand, electronic devices mounted on such portable electronic products have been required to have a reduced size and weight.

To reduce the size and weight of such electronic devices, a technique of reducing a size of an individual mounting component, a system on chip (SOC) technique for configuring a plurality of individual devices on a single chip, and a system in package (SIP) technique for integrating a plurality of individual devices as a single package have been continuously studied.

In particular, a high frequency electronic device module, such as a communication module or a network module, which uses a high frequency signal, may generate a large amount of heat during operations thereof as a frequency band increases. In this regard, there has been demand for an electronic device module capable of effectively releasing heat.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes: a substrate; a sealing portion disposed on a first surface of the substrate; an exothermic device disposed on the first surface of the substrate and embedded in the sealing portion; and a heat radiating portion at least partially embedded in the sealing portion. A lower surface of the heat radiating portion is bonded to one surface of the exothermic device. A side surface of the heat radiating portion is curved and is entirely in contact with the sealing portion. A plurality of grooves are disposed in the side surface of the heat radiating portion.

The heat radiating portion may include an exposed surface exposed to an outside of the sealing portion and opposing the lower surface of the heat radiating portion.

The heat radiating portion may have a horizontal cross-section area increasing toward the exposed surface.

The side surface of the heat radiating portion may be inclined.

The electronic device module may further include an electronic component mounted on the substrate in a position adjacent to the exothermic device. A portion of the heat radiating portion may face an upper surface of the electronic component.

The exposed surface of the heat radiating portion may have a surface area larger than a surface area of the one surface of the exothermic device.

A surface area of the lower surface of the heat radiating portion may be smaller than the surface area of the one surface of the exothermic device.

The side surface of the heat radiating portion may include a first side surface portion formed to have an arch shape and a second side surface portion having a ridge and a valley repeatedly disposed therein.

The electronic device module may further include a bonding layer disposed between the exothermic device and the heat radiating portion and bonding the exothermic device to the heat radiating portion.

The electronic device module may further include an electronic component mounted on the substrate in a position adjacent to the exothermic device. A mounting height of the electronic component may be greater than a mounting height of the exothermic device.

The electronic device module may further include an electronic component mounted on the first surface of the substrate and disposed outside of the sealing portion.

The electronic device may further include an antenna disposed inside the substrate or on a second surface of the substrate.

The antenna may include a patch antenna disposed in a region opposing the sealing portion.

The antenna may include a dipole antenna disposed in a region not opposing the sealing portion.

The electronic device module may further include a shielding layer disposed on a surface of the sealing portion and configured to shield an electromagnetic wave. One surface of the heat radiating portion may be bonded to the shielding layer.

The electronic device module may further include a shielding wall disposed inside the sealing portion and electrically connecting the substrate to the shielding layer.

In another general aspect, an electronic device module includes: a substrate; a sealing portion disposed on a first surface of the substrate; an exothermic device disposed on the first surface of the substrate and embedded in the sealing portion; and a heat radiating portion at least partially embedded in the sealing portion and having a lower surface bonded to one surface of the exothermic device. An entire interface between the heat radiating portion and the sealing portion is curved. A side surface of the heat radiating device and a side surface of the exothermic device are laterally spaced apart from each other by 150 µm or more.

The heat radiating portion may include an upper surface having a same shape as the lower surface of the heat radiating portion.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

Figure 1:
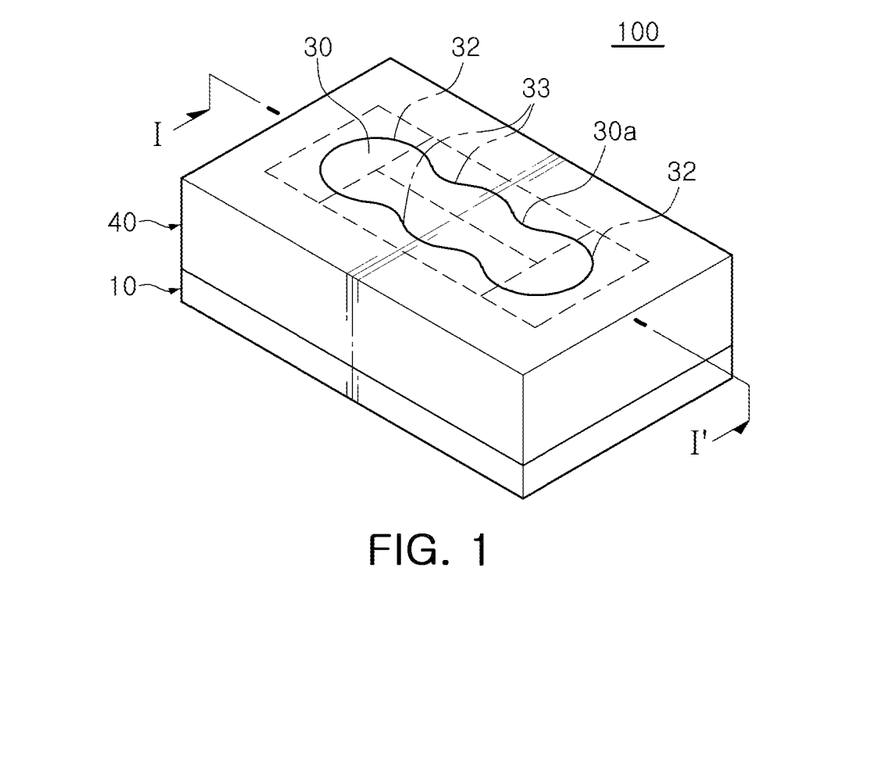
FIG. 1 is a perspective diagram illustrating an electronic device module, according to an embodiment.
Figure 2:
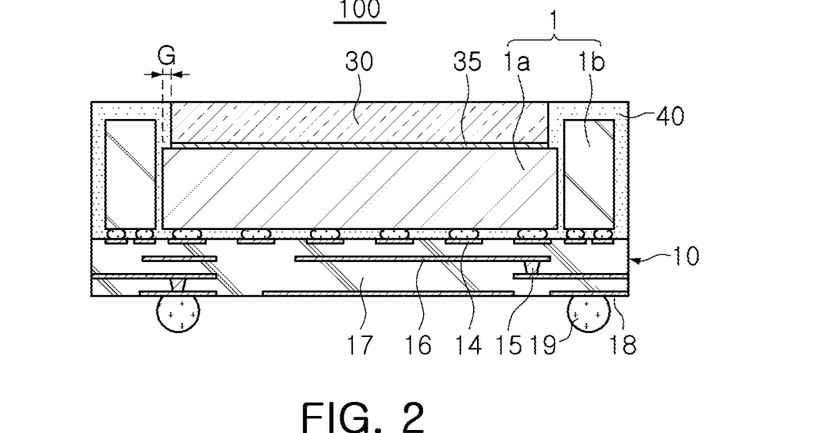
FIG. 2 is a cross-sectional view taken along line I-I' of FIG. 1.

FIG. 1 is a perspective diagram illustrating an electronic device module 100, according to an embodiment. FIG. 2 is a cross-sectional view taken along line I-I' of FIG. 1.

Referring to FIGS. 1 and 2, the electronic device module 100 may be configured to use a millimeter wave band to transmit and receive a wireless signal and may include, for example, a substrate 10, an electronic device 1, a sealing portion 40 and a heat radiating portion 30.

The substrate 10 may be a multilayer substrate formed by alternately stacking a plurality of insulating layers 17 and a plurality of wiring layers 16. However, in another example, the substrate 10 may be configured as a double-sided substrate in which wiring layers 16 are formed on both surfaces of a single insulating layer 17. For example, various types of generally used substrates (e.g., a printed circuit board, a flexible substrate, a ceramic substrate, a glass substrate, or the like) may be used as the substrate 10.

A material of the insulating layers 17 is not particularly limited. For example, an insulating material such as a thermosetting resin such as an epoxy resin, a thermoplastic resin such as a polyimide resin, or a resin in which the thermosetting resin or the thermoplastic resin is impregnated in a core material such as a glass fiber (glass cloth or glass fabric) along with an inorganic filler, such as prepreg, an Ajinomoto build-up film (ABF), FR-4, bismaleimide triazine (BT), or the like, may be used for the insulating layers 17.

The wiring layers 16 may be electrically connected to the electronic device 1, which will be described below.

A conductive material such as copper (Cu), aluminum (Al), silver (Ag), tin (Sn), gold (Au), nickel (Ni), lead (Pb), titanium (Ti), or alloys of Al, Ag, Sn, Au, Ni, Pb, and Ti, may be used as a material of the wiring layers 16.

Interlayer connection conductors 15 for connecting the layered wiring layers 16 to each other may be disposed in the insulating layer 17.

Further, an insulating protective layer may be disposed on a surface of the substrate 10. The insulating protective layer may be formed of solder resist and may be disposed to cover both an upper surface of an uppermost insulating layer 17 and a lower surface of a lowermost insulating layer 17, such that the insulating protective layer may protect an uppermost wiring layer 16 disposed on the upper surface of the uppermost insulating layer 17 and a lowermost wiring layer 16 disposed on the lower surface of the lowermost insulating layer.

The substrate 10 may include a first surface (e.g., an upper surface) and a second surface (e.g., a lower surface) opposing the first surface. The first surface may refer to a surface on which the electronic devices 1 are mounted, and the second surface may refer to a surface facing a main substrate when the electronic device module 100 is mounted on the main substrate. However, the first and second surfaces of the substrate 10 are not limited to the aforementioned example.

Mounting electrodes 14, which are used to mount the electronic device 1, may be disposed on the first surface of the substrate 10 and may be disposed with at least one ground electrode (e.g., ground electrode 14a in FIG. 7) if necessary.

Connection electrodes 18 to which a connection terminal 19 such as a solder ball may be bonded may be disposed on the second surface of the substrate 10. Accordingly, the electronic device module 100 may be electrically connected to an external entity through the connection electrodes 18 and the connection terminals 19.

The electronic device 1 is mounted on the first surface of the substrate 10. The electronic device 1 may include various devices such as an active device and a passive device. For example, any devices or components that are mountable on the substrate 10 may be used as the electronic device 1.

The electronic device 1 may also include a general device 1b and an exothermic device 1a. The general device 1b may be any electronic component. The exothermic device 1a may include an active surface (e.g., the lower surface shown in FIG. 2) having a terminal formed thereon and an inactive surface (e.g., the upper surface shown in FIG. 2) opposing the active surface.

The heat radiating portion 30 is bonded to the inactive surface of the exothermic device 1a and radiates heat generated in the exothermic device 1a to outside. The heat radiating portion 30 is, for example, formed as a single structure and may be bonded to the inactive surface of the exothermic device 1a by a bonding layer 35 disposed between the heat radiating portion 30 and the inactive surface of the exothermic device 1a.

For example, referring to FIG. 2, the heat radiating portion 30 has a lower surface bonded to an upper surface of the exothermic device 1a and a side surface bonded to the sealing portion 40, which will be described in more detail below. Further, an upper surface of the heat radiating portion 30 may be exposed to an outside of the sealing portion 40.

As illustrated in FIG. 1, an entire side surface of the heat radiating portion 30 may be curved. Accordingly, an interface between the heat radiating portion 30 and the sealing portion 40 may be curved.

To form the side surface of the heat radiating portion 30 to be curved, a plurality of grooves 30a may be disposed on the side surface of the heat radiating portion 30. For example, as illustrated in FIG. 1, at least a portion of the side surface of the heat radiating portion 30 may have a sine wave shape in which a ridge and a valley are repeatedly disposed in alternating order.

Alternatively, at least a portion of the side surface of the heat radiating portion 30 may be formed to have an arch shape. For example, the side surface of the heat radiating portion 30 may include a first side surface portion 32 having an arch shape only and a second side surface portion 33 having a sine wave form, but is not limited thereto. As another example, an entire side surface of the heat radiating portion 30 may have a sine wave form only.

As illustrated in FIG. 1, the heat radiating portion 30 may be disposed such that two second side surface portions 33 face each other and two first side surface portions 32 face each other. For example, as illustrated in FIG. 1, the two side surface portions 33 may be disposed on two longer sides facing each other and the two first side surface portions 32 may be disposed on two shorter sides, of the side surface of the heat radiating portion 30.

The bonding layer 35 may be formed by applying a resin-based bonding solution, such as an epoxy, to the inactive surface of the exothermic device 1a or the lower surface of the heat radiating portion 30.

The bonding layer 35 may be formed of an insulating material, but is not limited thereto. For example, various modifications are feasible, if necessary, for forming a metal thin film layer using a soldering method or forming a bonding layer using a conductive adhesive.

In the case in which the heat radiating portion 30 protrudes laterally from external side of the exothermic device 1a, there may be interference between the general device 1b, which is closely disposed to the exothermic device 1a, and the heat radiating portion 30. Accordingly, in the case in which a mounting height of the general device 1b is greater than a mounting height of the exothermic device 1a, a surface area of the lower surface of the heat radiating portion 30 may be smaller than a surface area of the upper surface of the exothermic device 1a. Thus, the entire lower surface of the heat radiating portion 30 may be bonded to the upper surface of the exothermic device 1a.

In an case in which a surface area of the lower surface of the heat radiating portion 30 is similar to that of the upper surface of the exothermic device 1a, an adhesion solution applied to form the bonding layer 35 during the process of bonding the heat radiating portion 30 with the upper surface of the exothermic device 1a may flow toward the substrate 10 along the side surface of the exothermic device 1a.

To prevent such a problem and in consideration of mounting variations of the heat radiating portion, a lateral distance G (FIG. 2) between the side surface of the exothermic device 1a and the side surface of the heat radiating portion 30 may be 150 μm or more. However, the electronic device module 100 is not limited to the foregoing example. In a case in which the mounting height of the general device 1b is less than the mounting height of the exothermic device 1a, at least a portion of the heat radiating portion 30 may be configured to protrude laterally outside of the exothermic device 1a.

In a case in which the surface area of the lower surface of the heat radiating portion 30 is excessively small, it may be difficult to transfer heat of the exothermic device 1a to the heat radiating portion 30. Accordingly, the surface area of the lower surface of the heat radiating portion 30 of the example embodiment may be formed to be 50% or more of the surface area of the upper surface of the exothermic device 1a.

An exposed surface of the heat radiating portion 30, which is exposed to an outside of the sealing portion 40 may be disposed on a same plane as the surface of the sealing portion 40 in which the exposed surface of the heat radiating portion 30 is disposed. Accordingly, the exposed surface of the heat radiating portion 30 and the surface of the sealing portion may be formed to be flat.

The heat radiating portion 30, which is formed of a material having high thermal conductivity, may be formed of various materials. For example, the heat radiating portion 30 may be formed of a metal material such as copper (Cu), nickel (Ni), titanium (Ti), gold (Au), tin (Sn), or the like, but is not limited thereto. Alternatively, a non-metal material having high thermal conductivity, such as graphite, may be used to form the heat radiating portion 30.

The sealing portion 40 is formed on the first surface of the substrate 10. The heat radiating portion 30 and the electronic device 1 may be embedded in the sealing portion 40 on the first surface of the substrate 10.

The sealing portion 40 is filled between the electronic devices 1a and 1b to prevent electric shorts therebetween and surrounds the exteriors of the electronic devices 1a and 1b to fix the electronic devices 1a and 1b to the substrate 10, thereby protecting the electronic devices 1a and 1b from an external impact.

Further, the sealing portion 40 is bonded to the side surface of the heat radiating portion 30 to firmly fix the heat radiating portion 30 and the exothermic device 1a to the substrate 10 and protect the heat radiating portion 30 and the exothermic device 1a from an external impact.

The sealing portion 40 is formed of an insulating material. An epoxy molding compound (EMC) may be used for the sealing portion 40, but the disclosure is not limited to this example.

The electronic device module 100 includes the heat radiating portion 30 to effectively release heat generated in the exothermic device 1a.

However, there is a big difference between the thermal expansion coefficient of the heat radiating portion 30 formed of a metal material and the thermal expansion coefficient of the sealing portion 40 formed of a resin material. This may result in detachment at the interface between the heat radiating portion 30 and the sealing portion 40 as a temperature of the heat radiating portion 30 increases during operations of the electronic device module 100. Further, as a volume of the heat radiating portion 30 formed of a metal material increases relative to volume of the sealing portion 40, the portion of the sealing portion 40 surrounding the heat radiating portion 30 may be broken due to the increased volume of the heat radiating portion 30.

In particular, if an edge were formed at the interface of the sealing portion 40 and the heat radiating portion 30, shear stress would be concentrated on the edge, thereby facilitating detachment or breakage of the sealing portion 40.

However, in the electronic device module 100, an entire interface at which the sealing portion 40 and the heat radiating portion 30 are in contact with each other is curved, and there is no edge formed at the interface of the sealing portion 40 and the heat radiating portion 30. Thus, shear stress can be prevented from being concentrated on an edge, and adhesion applied to the interface between the sealing portion 40 and the heat radiating portion 30 can be maintained uniformly, thereby preventing detachment from occurring at the interface.

Further, the electronic device module 100 includes the plurality of grooves 30a repeatedly disposed on the side surface of the heat radiating portion 30. Accordingly, portions of the sealing portion 40 filled in the grooves 30a can maximally suppress movements of the heat radiating portion 30, thereby minimizing breakage of the sealing portion 40 or detachment of the interface.

The electronic device module 100 is not limited to the examples described above and can be modified in various ways.

Figure 3:
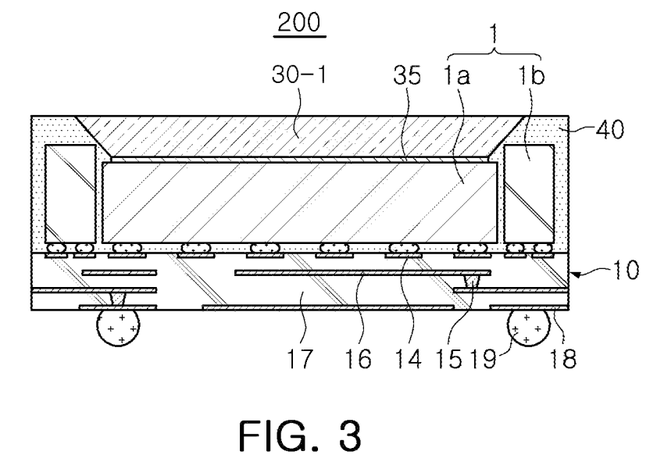
FIG. 3 is a cross-sectional view schematically illustrating an electronic device module, according to an embodiment.

FIG. 3 is a cross-sectional view schematically illustrating an electronic device module 200, according to an embodiment.

Referring to FIG. 3, the electronic device module 200 is configured similarly to the electronic device module 100 described above, but includes a heat radiating portion 30-1 having a different shape than that of the heat radiating portion 30 of the electronic device module 100.

The heat radiating portion 30-1 has a horizontal cross-section area that increases toward an upper surface of the heat radiating portion 30-1, which is an exposed surface. Thus, a side surface of the heat radiating portion 30-1 may be formed to be inclined, rather than perpendicular, with respect to a lower surface of the heat radiating portion 30-1.

Accordingly, the upper surface of the heat radiating portion 30-1 may have a surface area larger than a surface area of a lower surface of the heat radiating portion 30-1. For example, the upper surface of the heat radiating portion 30-1 may be formed to have a surface area larger than a surface area of the upper surface of an exothermic device 1a.

In this case, at least a portion of the upper surface of the heat radiating portion 30 may be disposed to protrude laterally outside of the exothermic device 1a. Further, at least a portion of an upper surface of a general device 1b, which is disposed close to the exothermic device 1a, may be disposed to face the portion of the heat radiating portion 30 that protrudes laterally outside of the exothermic device 1a.

The electronic device module 200 may increase a surface area of an exposed surface of the heat radiating portion 30 and may thus increase a heat radiating effect.

In the previously described example embodiments, however, a curve is formed around the heat radiating portion 30/30-1 with respect to a cross-section of the heat radiating portion 30/30-1. Accordingly, as illustrated in FIGS. 2 and 3, the side surface of the heat radiating portion 30/30-1 is shown to be linear, not curved, on a horizontal cross-section of the heat radiating portion 30/30-1.

Figure 4:
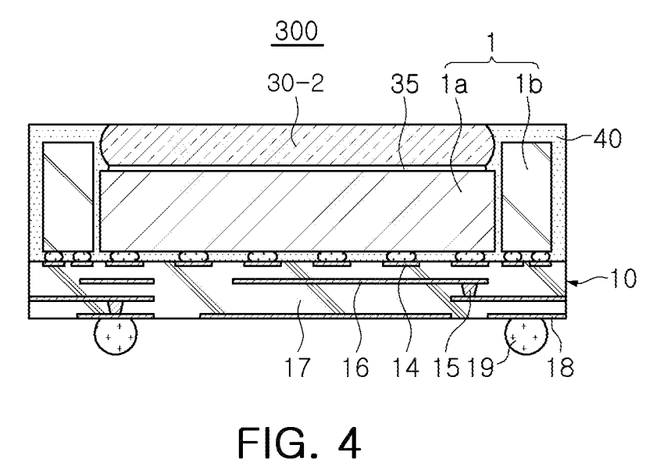
FIGS. 4 to 6 are perspective diagrams illustrating electronic device modules, according to embodiments.
Figure 5:
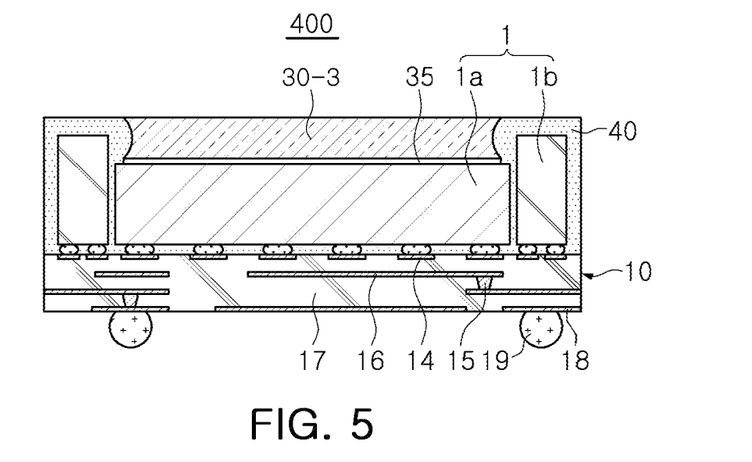
Figure 6:
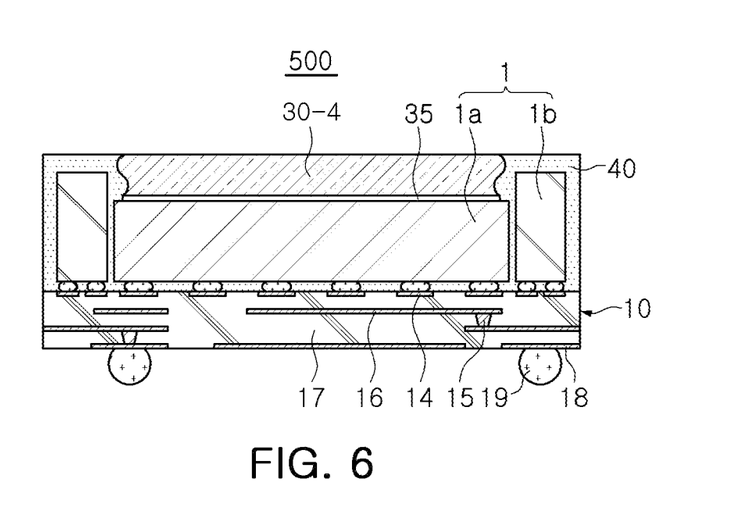

FIGS. 4, 5, and bare perspective diagrams illustrating electronic device modules 300, 400, and 500, respectively according to embodiments.

Electronic device modules illustrated in FIGS. 4, 5, and 6 include heat radiating portions 30-2, 30-2, and 30-4, respectively, having side surfaces that are curved on horizontal cross-section of the heat radiating portions 30-2, 30-2, and 30-4.

Referring to FIG., 4, in the electronic device module 300 a side surface of the heat radiating portion 30-2 is convex-curved outwardly with reference to a horizontal cross-section of the heat radiating portion 30-2. In the electronic device module 400 illustrated in FIG. 5, a side surface of a heat radiating portion 30-3 has a concave-curved shape. In the electronic device module 500 illustrated in FIG. 6, a side surface of a heat radiating portion 30-4 has an S-curve shape.

In the electronic device modules 300, 400, and 500, a bonding surface and an exposed surface of the heat radiating portions 30-2, 30-3, and 30-4 may be formed to have equal shapes and surface areas, but are not limited to such a configuration. If necessary, the bonding surface and the exposed surface may be formed to have different shapes and surface areas.

Further, a cross-sectional shape of the heat radiating portion may be similar to that of an exothermic device. For example, in the case of an upper surface of the exothermic device has a tetragonal shape, lower and upper surfaces of the heat radiating portion may be have tetragonal shapes.

As described above, the heat radiating portions 30, 30-1, 30-2, 30-3, and 30-4 may be subject to various modifications as long as entire side surfaces thereof are formed to be curved.

Figure 7:
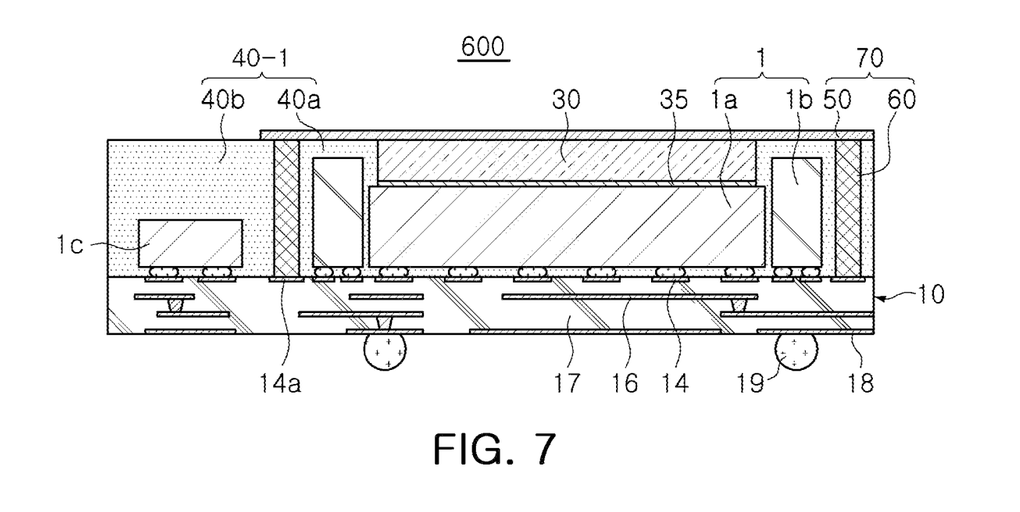
FIG. 7 is a cross-sectional view schematically illustrating an electronic device module, according to an embodiment.

FIG. 7 is a cross-sectional view schematically illustrating an electronic device module 600, according to an embodiment.

Referring to FIG. 7, the electronic device module 600 may include a shielding portion 70.

The shielding portion 70 is configured to shield electromagnetic waves flowing into or flowing out from the electronic device 1. The shielding portion 70 may include a shielding wall 60 and a shielding layer 50.

The shielding wall 60 is disposed in a sealing portion 40-1 in the form of a partition wall. The shielding wall 60 is spaced apart from an external side surface of the sealing portion 40-1 by a prescribed distance, and is thus not exposed to outside of the sealing portion 40-1. The shielding wall 60 may be disposed to surround the electronic devices 1a and 1b.

The shielding wall 60 may be electrically/physically connected to a ground electrode 14a of a substrate 10. For example, the shielding wall 60 may be disposed on the ground electrode 14a. An entirety of a lower portion of the shielding wall 60 may be bonded to the ground electrode 14a, but the shielding wall 60 is not limited to such a configuration. The shielding wall 60 may be partially bonded to the ground electrode 14a.

An upper end of the shielding wall 60 may be disposed on a same plane as an upper surface of the sealing portion 40-1. Specifically, an interface between the shielding wall 60 and the shielding layer 50 may be disposed on a same plane as an interface between the sealing portion 40-1 and the shielding layer 50. This configuration may be implemented by removing portions of the sealing portion 40-1 and the shielding wall 60 using a grinder during a manufacturing process.

The shielding wall 60 may be formed of a conductive material, or a polymer material containing metal or a conductive filler. For example, the shielding wall 60 may be formed using a conductive paste containing a conductive filler, but is not limited to being formed using a conductive paste.

The shielding layer 50 is formed along one surface (e.g. an upper surface), of surfaces of the sealing portion 40-1. Further, the shielding layer 50 may be disposed to cover the heat radiating portion 30.

An exposed surface of the heat radiating portion 30 may be used as a bonding surface for bonding to the shielding layer 50. However, the disclosure is not limited to the foregoing configuration. For example, at least a portion of the exposed surface of the heat radiating portion 30 may be configured to be exposed to outside of the shielding layer 50.

The shielding layer 50 may be formed of a conductive material such as a metal material (e.g., Cu, Ag, Au, Ni, Pt, Pd, or an alloy containing any one or any combination of any two or more of Cu, Ag, Au, Ni, Pt, and Pd), and is electrically connected to the ground electrode 14a of a substrate 10 by the shielding wall 60.

The shielding layer 50 may be prepared by applying a resin material containing a conductive powder or forming a thin film onto an external surface of the sealing portion 40-1. For example, the shielding layer 50 may be a metal thin film formed on the external surface of the sealing portion 40-1 by a sputtering method, but is not limited thereto. Various techniques such as spray coating, screen printing, vapor chemical deposition, electrolytic plating and electroless plating may be employed to form the thin film.

The shielding layer 50 is also disposed on an upper surface of the shielding wall 60 and is electrically connected to the shielding wall 60. Accordingly, a space bounded by the shielding layer 50, the shielding wall 60, and the substrate 10 may be provided as a shielding space capable of shielding an electromagnetic wave flowing in and out of the space.

The shielding layer 50 and the shielding wall 60 may be formed through different manufacturing processes. In this regard, the shielding layer 50 and the shielding wall 60 may be formed of different materials, but may alternatively be formed of the same material.

Further, the sealing portion 40-1 may include an internal sealing portion 40a and an external sealing portion 40b.

The internal sealing portion 40a is disposed in a shielding space bounded by the shielding layer 50, the shielding wall 60, and the substrate 10 and seals electronic devices 1 disposed in the shielding space.

The external sealing portion 40b is a portion disposed outside of the shielding wall 60.

The internal sealing portion 40a and the external sealing portion 40b are not connected to each other and are completely separated by the shielding wall 60 and the shielding layer 50, but are not limited to such a configuration. If necessary, the internal sealing portion 40a and the external sealing portion 40b may be partially connected to each other.

The shielding layer 50 is only disposed on an entirety of the internal sealing portion 40a but is not or is only partially disposed on the external sealing portion 40b. In this regard, at least a portion of one surface (e.g., the upper surface) of the external sealing portion 40b may be exposed to the outside of the shielding layer 50. However, the shielding layer 50 and the external sealing portion 40b are not limited to such a configuration. If necessary, the shielding layer 50 may be disposed on an entire surface of the external sealing portion 40b.

At least one electronic device 1c may be disposed in the external sealing portion 40b. The electronic device 1c may be an antenna device, but is not limited thereto.

The electronic device module 600 may not only protect the electronic device 1 mounted on the substrate 10 through the sealing portion 40-1 or the shielding portion 70, but may also shield an electromagnetic wave. Further, the sealing portion 40-1 is disposed externally of the shielding wall 60 and can thus prevent the shielding wall 60 from being broken by an impact from an outer environment.

In addition, the heat radiating portion 30 is connected to the shielding layer 50 and thus may release heat through the shielding portion 70, thereby increasing a heat radiating effect.

Figure 8:
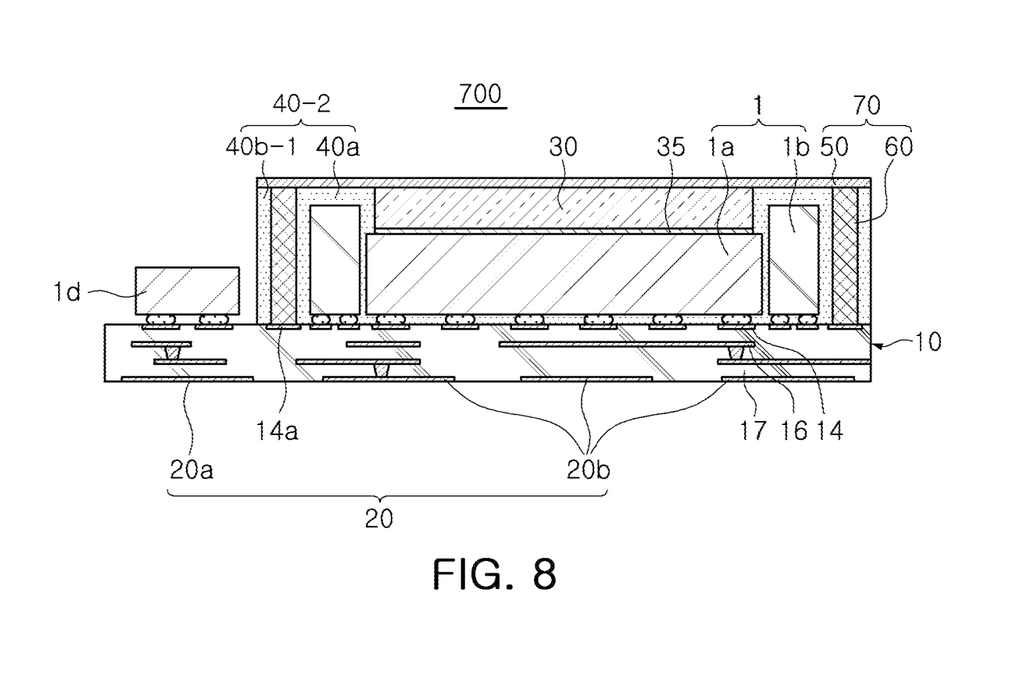
FIG. 8 is a cross-sectional view illustrating an electronic device module, according to an embodiment.

FIG. 8 is a cross-sectional view illustrating an electronic device module 700, according to an embodiment.

Referring to FIG. 8, the electronic device module 700 is configured similarly to the electronic device module 600 illustrated in FIG. 7, and but includes an electronic component 1d and a sealing portion 40-2.

The sealing portion 40-2 is partially disposed on the first surface of a substrate 10. The electronic component 1*d* is disposed outside of the sealing portion 40-2. For example, the electronic component 1*d* is disposed outside of an external sealing portion 40*b*-1 of the sealing portion 40-2.

The electronic component 1*d* may include a connector to which an FPCB or a cable is connected. In this regard, the electronic device module 700 may be electrically connected to outside through the electronic component 1*d*, rather than through a connection terminal. However, the disclosure is not limited to the foregoing configuration. The electronic component 1*d* may include an antenna device or other active and passive devices.

Alternately, the electronic device module 700 may include an antenna 20 on one surface or inside of the substrate 10.

The antenna 20 may be formed in the form of a circuit wire. For example, a portion of a wiring layer 16 of the substrate 10 may be used as an antenna 20. For example, the antenna 20 may be disposed on a second surface of the substrate 10 or on the wiring layer 16 close to the second surface of the substrate 10 while being disposed inside the substrate 10.

The electronic device module 700 is electrically connected to an outside component or device through the electronic component 1*d* and can thus use the entire second surface of the substrate 10 as an antenna region. Accordingly, a size of the antenna 20 can be increased, thereby increasing radiation efficacy of the antenna 20.

A case in which the antenna 20 is configured in the form of a circuit wire is shown in FIG. 8, but the antenna 20 is not limited to a circuit wire. The antenna 20 is subject to various modifications and may be provided in the form of a device mountable on a substrate, such as a chip antenna, to mount on the second surface of the substrate 10.

The antenna 20 may be disposed on a first region of the second surface of the substrate 10, which is a region facing or opposing the sealing portion 40-2, and/or on a second region on the second surface of the substrate 10, which is a region not facing or opposing the sealing portion 40-2, but is not limited to such a configuration. If necessary, the antenna 20 may be selectively disposed on any one of the first and second regions.

In the description herein, the description of the antenna 20 "facing or opposing the sealing portion 40-2 means that the antenna 20 is disposed to overlap with the sealing portion 40-2 when projected onto the first surface of the substrate 10.

In the case in which the antenna 20 is disposed in the region opposing the sealing portion 40-2, a wireless signal transmitted to or received by the antenna 20 may be shielded by the shielding portion 70. Accordingly, an antenna radiating a wireless signal in various directions may be disposed in the first region in which no shielding portion 70 is present. In contrast, an antenna 20 configured to radiate a wireless signal toward the second surface of the substrate 10 only may be disposed in the second region, as well.

For example, it may be advantageous that a dipole antenna 20*a* configured to radiate a wireless signal in a direction parallel to the substrate 10 is disposed in the first region. In contrast, a patch antenna 20*b* configured to radiate a wireless signal in a direction toward the second surface of the substrate 10, of directions perpendicular to the substrate 10, may be disposed in the second region.

According to the embodiments described herein, an electronic device module may be configured such that an entire interface at which a sealing portion and a heat radiating portion are in contact with each other is curved. Thus, bonding stress between the sealing portion and the heat radiating portion may be minimized, thereby resisting detachment at the interface or breakage of the sealing portion.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module, comprising:
    a substrate;
    an exothermic device disposed on a first surface of the substrate;
    a sealing portion embedding the exothermic device disposed on the first surface of the substrate; and
    a heat radiating portion at least partially embedded in the sealing portion,
    wherein a lower surface of the heat radiating portion is bonded to one surface of the exothermic device, a side surface of the heat radiating portion is curved and is entirely in contact with the sealing portion, and a plurality of grooves are disposed in the side surface of the heat radiating portion.

2. The electronic device module of claim 1, wherein the heat radiating portion comprises an exposed surface exposed to an outside of the sealing portion and opposing the lower surface of the heat radiating portion.

3. The electronic device module of claim 2, wherein the heat radiating portion has a horizontal cross-section area increasing toward the exposed surface.

4. The electronic device module of claim 3, wherein the side surface of the heat radiating portion is inclined.

5. The electronic device module of claim 3, further comprising an electronic component mounted on the substrate in a position adjacent to the exothermic device,
    wherein a portion of the heat radiating portion faces an upper surface of the electronic component.

6. The electronic device module of claim 2, wherein the exposed surface of the heat radiating portion has a surface area larger than a surface area of the one surface of the exothermic device.

7. The electronic device module of claim 6, wherein a surface area of the lower surface of the heat radiating portion is smaller than the surface area of the one surface of the exothermic device.

8. The electronic device module of claim 1, wherein the side surface of the heat radiating portion comprises a first side surface portion formed to have an arch shape and a second side surface portion having a ridge and a valley repeatedly disposed therein.

9. The electronic device module of claim 1, further comprising a bonding layer disposed between the exothermic device and the heat radiating portion and bonding the exothermic device to the heat radiating portion.

10. The electronic device module of claim 1, further comprising an electronic component mounted on the substrate in a position adjacent to the exothermic device,
wherein a mounting height of the electronic component is greater than a mounting height of the exothermic device.

11. The electronic device module of claim 1, further comprising an electronic component mounted on the first surface of the substrate and disposed outside of the sealing portion.

12. The electronic device module of claim 10, further comprising an antenna disposed inside the substrate or on a second surface of the substrate.

13. The electronic device module of claim 12, wherein the antenna comprises a patch antenna disposed in a region opposing the sealing portion.

14. The electronic device module of claim 12, wherein the antenna comprises a dipole antenna disposed in a region not opposing the sealing portion.

15. The electronic device module of claim 1, further comprising a shielding layer disposed on a surface of the sealing portion and configured to shield an electromagnetic wave,
wherein one surface of the heat radiating portion is bonded to the shielding layer.

16. The electronic device module of claim 15, further comprising a shielding wall disposed inside the sealing portion and electrically connecting the substrate to the shielding layer.

17. An electronic device module, comprising:
a substrate;
an exothermic device disposed on a first surface of the substrate;
a sealing portion embedding the exothermic device disposed on the first surface of the substrate; and
a heat radiating portion at least partially embedded in the sealing portion and comprising a lower surface bonded to one surface of the exothermic device,
wherein an entire interface between the heat radiating portion and the sealing portion is curved, and
wherein a side surface plane of the heat radiating portion and a side surface plane of the exothermic device are laterally spaced apart from each other by 150 μm or more.

18. The electronic device module of claim 17, wherein the heat radiating portion comprises an upper surface having a same shape as the lower surface of the heat radiating portion.

* * * * *